(12) United States Patent
Mates

(10) Patent No.: US 7,089,473 B2
(45) Date of Patent: Aug. 8, 2006

(54) METHOD AND APPARATUS FOR TESTING A CIRCUIT USING A DIE FRAME LOGIC ANALYZER

(75) Inventor: John W. Mates, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 359 days.

(21) Appl. No.: 10/109,762

(22) Filed: Mar. 29, 2002

(65) Prior Publication Data

US 2003/0188237 A1 Oct. 2, 2003

(51) Int. Cl.
*G01R 31/28* (2006.01)

(52) U.S. Cl. .......................................... 714/733; 714/39
(58) Field of Classification Search ................. 714/724, 714/727, 733, 39; 438/14; 324/765, 158
See application file for complete search history.

(56) References Cited

U.S. PATENT DOCUMENTS

| | | | |
|---|---|---|---|
| 5,504,756 A | 4/1996 | Kim et al. | |
| 5,574,733 A | 11/1996 | Kim | |
| 5,757,818 A | 5/1998 | Ashuri | |
| 5,796,282 A | 8/1998 | Sprague et al. | |
| 5,872,795 A | 2/1999 | Parvathala et al. | |
| 5,929,650 A * | 7/1999 | Pappert et al. | 324/763 |
| 5,959,462 A * | 9/1999 | Lum | 324/765 |
| 5,968,181 A | 10/1999 | Tomioka | |
| 5,993,055 A | 11/1999 | Williams | |
| 6,016,563 A | 1/2000 | Fleisher | |
| 6,046,600 A * | 4/2000 | Whetsel | 324/763 |
| 6,064,213 A * | 5/2000 | Khandros et al. | 324/754 |
| 6,182,247 B1 | 1/2001 | Herrmann et al. | |
| 6,212,652 B1 | 4/2001 | Williams | |
| 6,286,114 B1 * | 9/2001 | Veenstra et al. | 714/39 |
| 6,427,222 B1 * | 7/2002 | Shau | 716/4 |
| 6,429,029 B1 * | 8/2002 | Eldridge et al. | 438/14 |
| 6,564,347 B1 * | 5/2003 | Mates | 714/727 |
| 6,633,838 B1 * | 10/2003 | Arimilli et al. | 703/16 |
| 2003/0126508 A1 * | 7/2003 | Litt | 714/39 |

OTHER PUBLICATIONS

Texas Instruments; IEEE Std 1149.1 (JTAG) Testability; 1997 Semiconductor Group; pp. 77.

* cited by examiner

*Primary Examiner*—Albert Decady
*Assistant Examiner*—John P. Trimmings
(74) *Attorney, Agent, or Firm*—Cynthia T. Faatz

(57) ABSTRACT

A die frame logic analyzer unit. For one aspect, a programmable logic analyzer unit is provided, wherein at least a first portion of the programmable logic analyzer unit is provided in a die frame. The programmable logic analyzer unit is to test a function of an integrated circuit on a wafer that includes the die frame.

31 Claims, 4 Drawing Sheets

METHOD AND APPARATUS FOR TESTING A CIRCUIT USING A DIE FRAME LOGIC ANALYZER

CROSS-REFERENCE TO RELATED APPLICATION

The present application is related to copending U.S. patent application Ser. No. 09/364,326 entitled, "A METHOD AND APPARATUS FOR TESTING AN INTEGRATED CIRCUIT USING AN ON-CHIP LOGIC ANALYZER UNIT," filed Jul. 29, 1999 and assigned to the assignee of the present invention.

BACKGROUND

1. Field

An embodiment of the present invention relates to the field of testing integrated circuits and more specifically, to a method and apparatus for testing an integrated circuit using a logic analyzer unit (LAU) provided in a die frame.

2. Discussion of Related Art

Once an integrated circuit, such as a microprocessor, has been designed and fabricated, the integrated circuit is tested to determine whether it functions as intended and to define the environmental parameters (e.g. die temperatures, power supply noise, voltage levels and/or core clock frequencies) within which it functions as intended.

For post-fabrication validation testing, for example, a logic analyzer may be used to perform a particular level of functional testing. In general terms, a logic analyzer is connected to a device to be tested using one or more probes. A processor in the logic analyzer executes instructions in response to commands received via a logic analyzer user interface. The executed instructions cause the logic analyzer to stimulate the device being tested via the one or more probes with one or more test signals, referred to herein as signal vectors.

In response to receiving a signal vector from the logic analyzer, the device under test generates one or more response signal vectors that are sent to the logic analyzer via the probes and may be displayed on a display or other output device connected to the logic analyzer. Pass/fail functionality of the device under test may be determined by comparing reference signal vectors stored by the logic analyzer with the response signal vectors received from the device under test.

In order to test an integrated circuit effectively, a logic analyzer should be capable of applying and receiving signal vectors at a rate at least equal to the desired operating speed of the integrated circuit being tested. Thus, as the operating clock frequency of each generation of integrated circuits continues to increase, logic analyzers used to test integrated circuits must also become faster.

As logic analyzers (and other similar testers) increase in speed, however, they also increase in cost and design complexity. Additionally, most integrated circuit manufacturers purchase logic analyzers from external vendors who may have difficulty producing products that meet the integrated circuit manufacturers technical requirements in a timely manner. Further, using logic analyzer probes, it may not be possible to access all of the signals that are desirable to test.

To improve testability, many integrated circuits include "design for testability" (DFT) features that provide for embedded testing of certain integrated circuit functions. Some of these features may be compatible with the IEEE standard 1149.1-1990, IEEE Standard Test Access Port and Boundary-Scan Architecture produced by the Joint Test Action Group (JTAG), often referred to simply as JTAG. An integrated circuit device designed in accordance with IEEE Std. 1149.1 provides for test instructions and data to be serially transferred into the device and response data to be serially transferred out of the device using four extra pins included specifically for this purpose.

Other examples of DFT features include scan chains for testing circuits including sequential logic, specialized state machines for generating test patterns for specific circuitry and cyclic redundancy check (CRC) bits to verify programmable circuitry.

DFT features may provide for testing of integrated circuits, including circuits internal to a chip, that are difficult to access using external test equipment. While DFT features can facilitate testing of particular integrated circuit functions, the testing capabilities of each feature may be limited in scope. Thus, DFT features often provide a piecemeal approach to integrated circuit testing.

Built-In Self-Test (BIST) capability (another DFT feature) is also included in many integrated circuit devices. BIST is typically implemented as a microcoded program in microcode Read Only Memory (ROM) to exercise the microarchitectural elements of the host integrated circuit to determine whether they logically operate as specified. Because BIST is a firmware tool, it is relatively inflexible. Further, BIST typically only produces a pass/fail indication such that further and more extensive testing (possibly using an external logic analyzer) must be performed to identify the source of a circuit failure, for example.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for testing an integrated circuit using a die frame logic analyzer are described. In the following description, particular types of integrated circuits, integrated circuit configurations, wafer configurations and systems are described for purposes of illustration. It will be appreciated, however, that other embodiments are applicable to other types of integrated circuits, and to systems, wafers and integrated circuits configured in another manner.

For one embodiment, at least a first portion of a programmable logic analyzer unit (LAU) is provided in a die frame. The programmable logic analyzer unit is provided to test a function of an integrated circuit on a wafer that includes the die frame. In this manner, for validation testing, for example, an external logic analyzer does not need to be used.

The die frame LAU (alternately referred to herein as a DFLAU) may provide most of the functionality of current, external logic analyzers while being capable of scaling with the speed of the integrated circuit device being tested. Further, the die frame LAU of one embodiment provides for more comprehensive on-chip testing capabilities than prior, conventional, embedded design for testability (DFT) features. Additionally, by being programmable, test routines can be added after manufacture of the integrated circuit to be tested.

Figure 1:
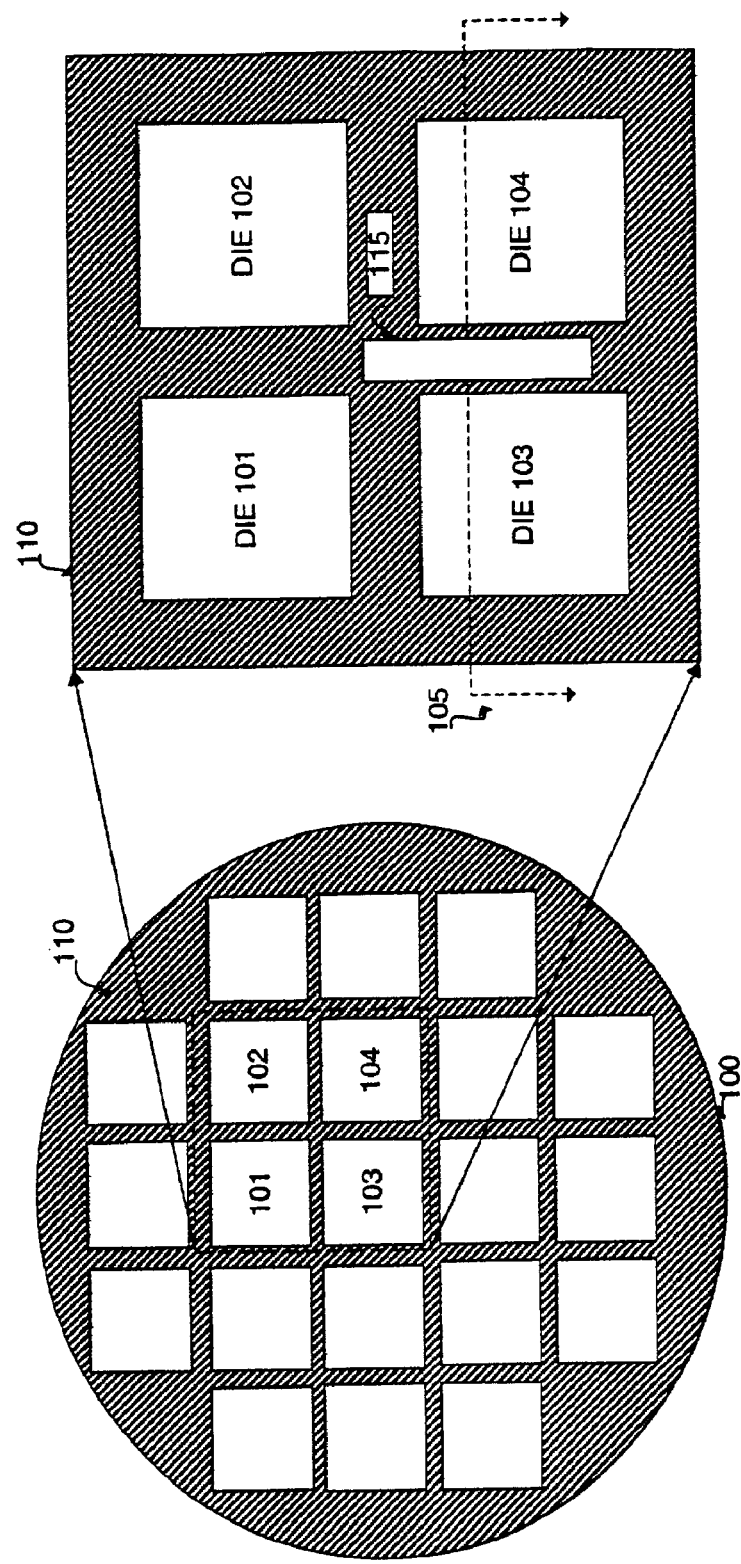
FIG. 1 is a diagram showing an exemplary semiconductor wafer including dice and die frame area.

The term "die frame" refers to the area on a semiconductor wafer that is not part of an integrated circuit die. For example, FIG. 1 shows a wafer 100 that includes several dice, some of which are indicated with the reference numbers 101–104 for purposes of illustration. The shaded area 110 of the wafer surrounding the dice is referred to herein as the die frame.

An exploded view of the dice 101–104 and the die frame area 110 surrounding them is also shown in FIG. 1. Included within the die frame area 110 is an exemplary die frame logic analyzer unit 115 of one embodiment.

Figure 2:
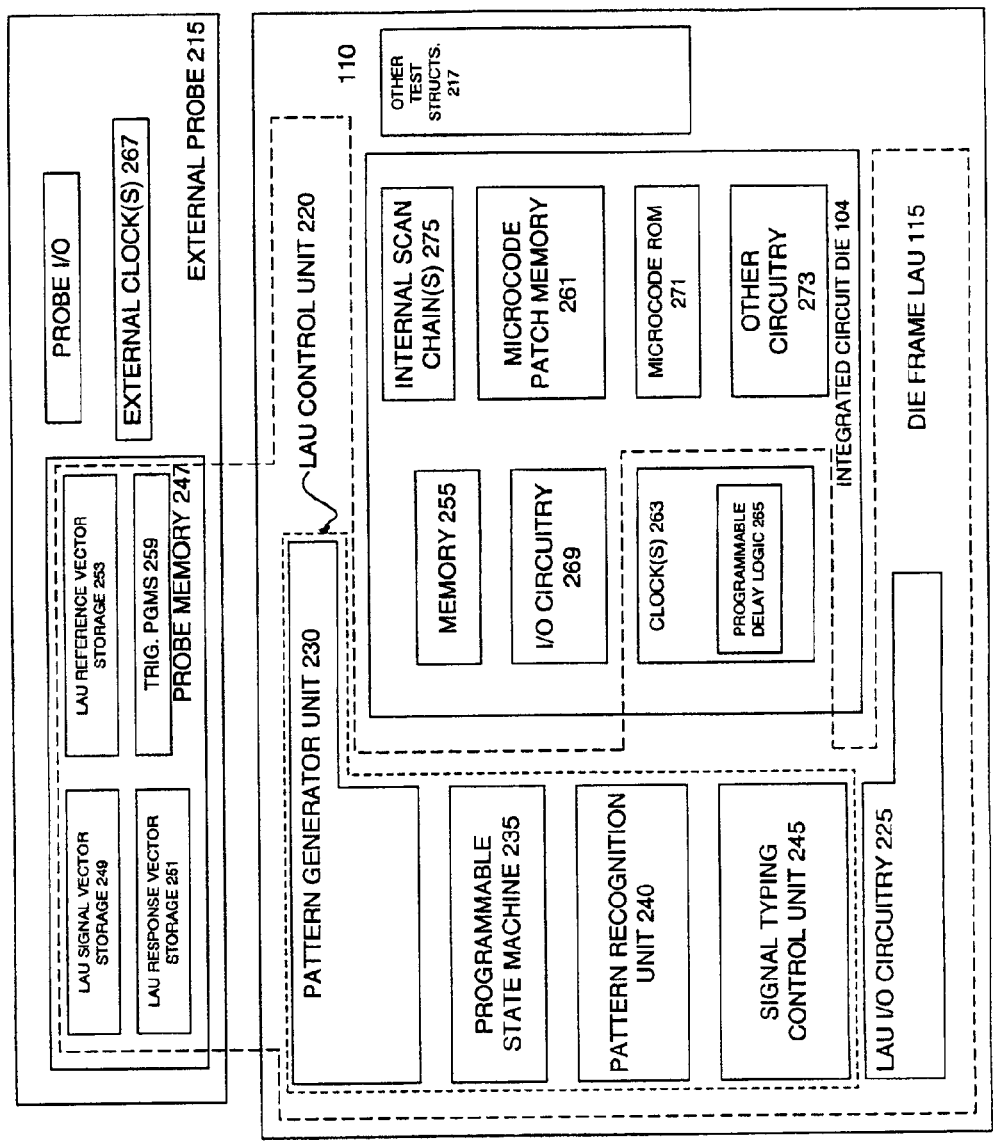
FIG. 2 is a block diagram of a die frame logic analyzer unit of one embodiment, an exemplary integrated circuit die that may be analyzed and/or tested using the exemplary die frame logic analyzer unit, and an external probe that may be used cooperatively with the die frame logic analyzer unit to test the exemplary integrated circuit die.

FIG. 2 is a block diagram showing in more detail the die frame LAU 115 and one of the integrated circuit die 104 to be analyzed by the die frame LAU 115. It will be appreciated that the die frame LAU 115 of some embodiments is capable of testing/analyzing multiple die.

Also shown in FIG. 2 is an external probe 215 that may work cooperatively with the die frame LAU 115 to analyze and/or test the integrated circuit die 104 (and/or other dice) as described in more detail below. It will be appreciated that other types of structures, such as other test structures 217, may also be provided in the die frame area for some embodiments.

The die frame LAU 115 includes an LAU control unit 220 and LAU I/O circuitry 225. The LAU control unit 220 controls the operation of the die frame LAU 115 and may include, for example, a pattern generator unit 230, a programmable state machine 235, a pattern recognition unit 240, and a signal typing control unit 245. The function and operation of each of these units is described in more detail below.

For one embodiment, the LAU control unit 220 is implemented using a microprocessor core. Examples of microprocessor cores that may be used for various embodiments include an i386 processor core from Intel Corporation of Santa Clara, Calif., an Advanced RISC Machines (ARM) processor core designed by Advanced RISC Machines Ltd. of Cambridge, England, or a Z80 processor core from ZiLOG, Inc. of Campbell, Calif. For another embodiment, the LAU control unit 220 may be implemented using a custom microcontroller core. Other types of controller logic or processor cores, including more complex processor cores, may be used for other embodiments.

A decision regarding the particular core to be used may be based on several factors including, for example, the complexity of the integrated circuit to be tested by the die frame logic analyzer, the available die frame area, and/or the complexity of the desired analysis of the integrated circuit to be tested.

The die frame LAU 115 of one embodiment also includes memory for storage of signal, response and/or reference vectors to be used during testing of the integrated circuit die 104. For one embodiment, these vectors are stored in probe memory 247 provided on the external probe 215. The probe memory 247 may include, for example, an LAU signal vector storage area 249, an LAU response vector storage area 251 and an LAU reference vector storage area 253. The probe memory 247 may be any type of memory such as dynamic random access memory (DRAM) or static random access memory (SRAM), for example and may also be used for purposes other than vector storage for the die frame LAU 115.

For another embodiment, the die frame LAU 115 may utilize on-chip memory 255 on the integrated circuit die 104 to store some or all of the above-described vectors. The on-chip memory 255 may comprise cache memory, register memory or translation lookaside buffer memory, for example. For still another embodiment, dedicated die frame LAU memory (not shown) may be provided in die frame area 110 outside of the integrated circuit die 104.

For some embodiment., the die frame LAU 115 may include additional memory to store one or more triggerable program(s) to be executed in response to the occurrence of a predetermined signal pattern(s). This additional memory 259 may similarly be provided as part of the probe memory 247, as dedicated die frame LAU memory (riot shown) or may be part of a memory on the integrated circuit die 104 to be analyzed, such as the memory 255 or a writeable microcode patch memory 261, for example, that is provided to correct microcode or other errors on the integrated circuit 104. For one embodiment, the one or more triggerable program(s) may be implemented as a state machine, for example, using well-known programming techniques.

The die frame LAU 115 may also include clocking circuitry and programmable clock delay logic. For one embodiment, the die frame LAU 115 uses on-die clock circuitry 263 provided on the integrated circuit die 104 to be tested and associated programmable delay logic 265 to control testing of the integrated circuit die 104. For another embodiment, dedicated LAU clock circuitry (not shown) may be provided in the die frame LAU 115. Alternatively, or additionally, one or more external clock sources 267 may be coupled to the die frame LAU 115 through the external probe 215 and/or may be provided directly on the external probe 215.

It will be appreciated that the die frame LAU of other embodiments may include elements not shown in FIG. 2 and/or may not include all of the elements shown in FIG. 2.

With continuing reference to FIG. 2, the exemplary integrated circuit die 104 is a processor for purposes of illustration, but other embodiments are applicable to other types of integrated circuits. In addition to the circuitry described above, the integrated circuit die 104 may include input/output (I/O) circuitry 269, a microcode read only memory (ROM) 271, and other circuitry 273 such as, for example, datapath circuitry, control circuitry, etc. For some embodiments, the I/O circuitry 269 may include boundary scan circuitry in accordance with the JTAG specification as described above.

One or more internal scan chains 275 may also be provided for testability purposes. The internal scan chain(s) 275 may be provided to test specific logic on the integrated circuit die 104 and may be coupled to boundary scan circuitry provided in the 110 circuitry 269, for one embodiment.

The external probe 215 is provided to couple the die frame LAU 115 with the integrated circuit die 104 during testing such that circuitry on the integrated circuit die 210 may be analyzed. Buffering circuitry (not shown) may be provided in the signal paths between the die frame LAU 115 and the integrated circuit die under test 104 to provide for proper operation of the die frame LAU 115.

Figure 3:
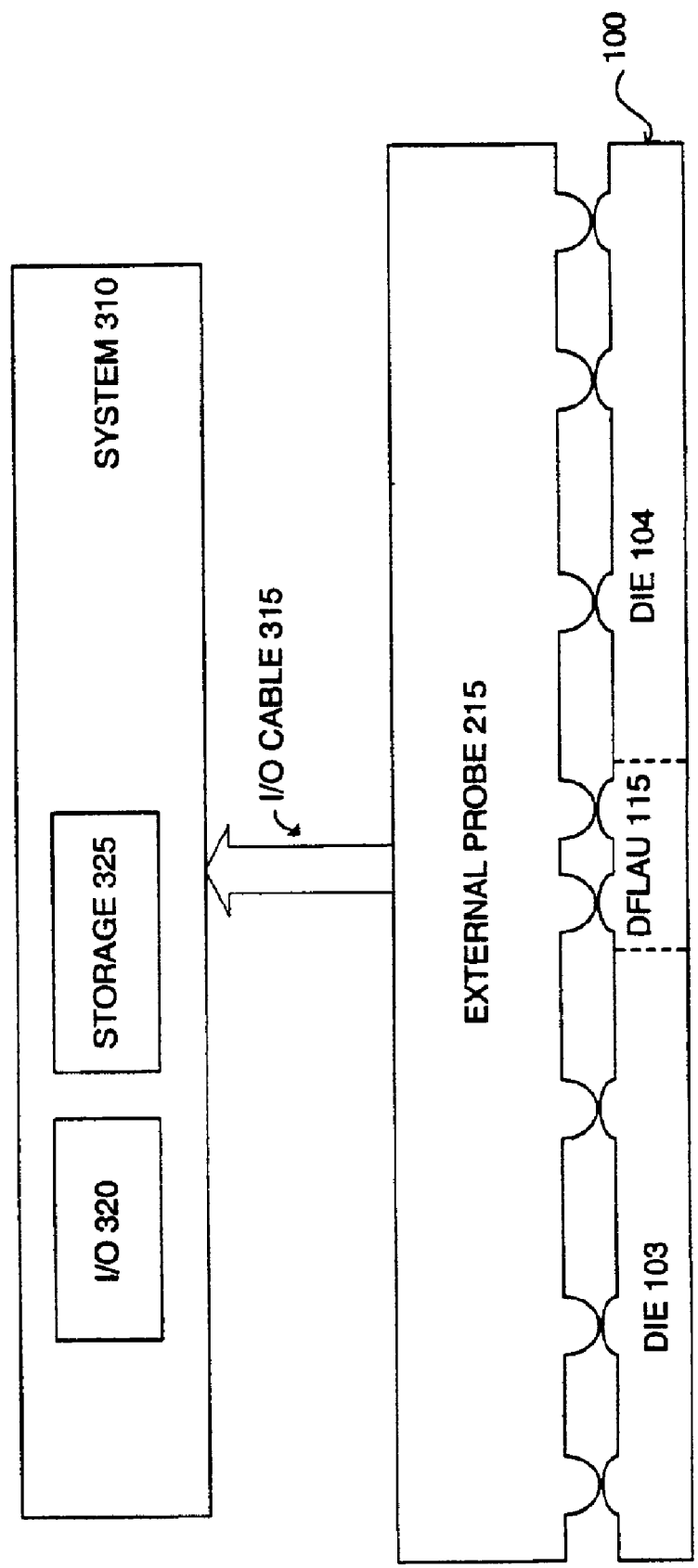
FIG. 3 is a cross-sectional view of an exemplary external probe, a die frame logic analyzer unit and two integrated circuit die in accordance with one embodiment.

FIG. 3 shows a cross-sectional outline view of the exemplary external probe 215 of FIG. 2. The external probe 215 may be coupled to a system 310, such as a test system, via an input/output (I/O) cable 315 or other I/O arrangement. The external probe 215 may be similar to, for example, a probe used during wafer probe testing, but with a different probe configuration that provides for use of the die frame logic analyzer unit as described herein.

The system 310 may include one or more system I/O component(s) 320 such as a keyboard, a display, a printer and/or a cursor control device, for example. The system 310 may also include storage 325 such as one or more memories and/or a mass storage device, for example. Other types of systems and/or systems configured in another manner are within the scope of various embodiments.

Also shown in FIG. 3 is a cross-sectional view of a portion of the wafer 100 of FIG. 1 taken along the line 105. For purposes of example, the external probe 215 is shown in FIG. 3 as being electrically coupled to two integrated circuit dice 103 and 104 and to the die frame logic analyzer unit 115. For the embodiment shown in FIG. 3, the integrated circuit dice 103 and 104 and the die frame LAU 115 each include solder bumps as shown to provide external electrical connections to various points within the integrated circuit dice 103 and 104 and the LAU 115. Other approaches for providing external electrical connections to access various structures within the integrated circuit dice 103 and 104 are within the scope of various embodiments.

The exemplary external probe 215 also includes solder bumps or other protrusions that correspond to some or all of the external electrical connection points on one or more of the integrated circuit dice 103 and 104. In this manner, electrical signals can be transmitted between the die frame logic analyzer unit 115 and one or more of the dice 103 and 104 via the external probe 215. Additionally, communication between the system 310 and one or more of the dice 103 end 104 and the die frame LAU 115 may be enabled via the probe 215.

Using some or all of the above-described circuit blocks and components, the die frame LAU 115 of one embodiment is capable of performing many of the same functions as conventional, external logic analyzers. Some examples of these capabilities are described in more detail below.

With continuing reference to FIGS. 2 and 3, as described above, for one embodiment, the die frame LAU 115 may be coupled to input and/or output pins or pads of the integrated circuit dice 103 and/or 104 via the external probe 215. The die frame LAU 115 may also be coupled to some internal chip circuitry in one or more of the dice 103 and/or 104 through connections to one or more internal scan chain(s) 275 also using the external probe 215. For some embodiments, the die frame LAU 115 may also be coupled to other internal circuitry within the integrated circuit die 103 and/or 104 (and/or other dice not shown) by direct connections to various nodes within the respective integrated circuit dice and/or by multi-way switches (muxes), for example, that provide for selective connections to nodes of the respective integrated circuit dice based upon a test to be performed. Other approaches to coupling the die frame LAU 115 to signal lines, buses, nodes and/or circuits on an integrated circuit to be tested or analyzed may also be used for various embodiments.

A designer of the integrated circuits on integrated circuit dice 103 and 104, for example, may choose the types and locations of connections between the due frame LAU 115 and the integrated circuits di(c)e to be tested based on circuits and signal lines desired to be analyzed. In this manner, the die frame LAU 115 of some embodiments is capable of testing/analizing circuit inplementations, signal lines, etc., that may not easily be tested by other types of circuitry. Thus. In contrast to BIST firmware, for example, the die frame LAU 115 may be capable of probing arbitrary wires in the circuit implementation of a microarchitecture rather than being limited to testing the logical operation of microarchitectural elements.

Further, the die frame LAU 115 of some embodiments is capable of examining physical as well as logical aspects of the events in wires and memory elements of the integrated circuit die under test. Additionally, the programmable nature of the die frame LAU 115 makes it quite flexible in terms of varying tests to be performed, etc. in comparison to BIST routines. While BIST routines produce a pass/fail indication, the die frame LAU 115 may be used as a debugging tool to observe operation of the integrated circuits to which it is coupled at a lower level.

In operation, a user may initiate, test of one or more integrated circuit dice on a wafer that includes the die frame logic analyzer unit 115 of one embodiment via an input device 320 of the system 310. Such an input signal may be received by the die frame LAU 115 via the. I/O cable 315 and the external probe 215, for example. A specific test to be performed may be indicated by the user. Alternatively, the programmable state machine 235 may perform a predetermined test sequence in response to a test signal for example, that is either initiated by the user or s responsive to given conditions within the integrated circuit to be tested.

In further describing the function and operation of the die frame LAU 115, reference is made to testing and/or analysis of the integrated circuit die 104. It will be appreciated that similar analysis and testing of other integrated circuit die on the wafer 100 may be performed in a similar manner by the die frame LAU 115, or by other die frame logic analyzer(s) provided on the wafer 100. For one embodiment, multiple dice can be tested/analyzed by a single die frame logic analyzer unit with the particular die (or dice) being tested depending on the placement of the external probe 215, and thus, the electrical connections between the die frame LAU 115 and a die (or dice) to be tested.

With continuing reference to FIGS. 2 and 3, when a test operation or sequence is initiated, one or more signal vectors are applied to one or more circuits under test on the die 104 using the external probe 215 for one embodiment. For example, the LAU control unit 220 may retrieve the one or more signal vectors from LAU signal vector storage memory 249 or another memory that stores signal vectors.

The signal vectors stored in the LAU signal vector storage memory 249 may be generated by the pattern generator unit 230 and stored in the memory 249 upon initiating a test mode on the die frame LAU 115, for example. Alternatively, the signal vectors may be stored in the LAU signal vector storage memory 249 (or another memory) by a program that is stored in a memory or data storage medium of the system 310 and executed by a processor (not shown) on the system 310. For another embodiment, the pattern generator unit 230 may generate signal vector(s) to be applied based upon a test to be performed without storing the signal vector(s) in the LAU signal vector storage memory 249.

It will be appreciated that some of the units, such as the pattern generator unit 230, within the LAU control unit 220 may be implemented in dedicated hardware that is set up and controlled by the LAU control unit 220. Alternatively, the pattern generator unit 230 and/or other units within the LAU control unit 220 may be implemented using the existing capabilities of a microprocessor core that is used to implement the LAU control unit 220. Other approaches to providing the functionality of the units within the LAU control unit 220 are within the scope of various embodiments.

In response to stimulating circuitry on the die 104 with signal vector(s) during testing, one or more response vector(s) may be returned to the die frame LAU 115 from the circuit(s) under test. The vectors may be returned, for example, via probe points that are directly connected to the circuitry under test or are connected to the circuitry under test via I/O circuitry 269 or scan circuitry 275, for example. The response vector(s) may be displayed to a user via an output device 320 and/or stored in the LAU response vector storage memory 251. If the response vector(s) are displayed, they may be communicated from the chip 104 to the output device(s) 320 via the external probe 215 and the I/O cable 315. For some tests, the response vector(s) may be compared to corresponding reference vector(s) stored in the LAU reference vector storage memory 253 to determine whether the integrated circuit die 104 passed or failed the particular test being performed. For other tests, a pass/fail determination may be based on response timing as determined by one of the clocks 263 or a shifted clock signal, for example.

For one embodiment, the particular circuit(s) to be tested and signal vector(s) to be applied are controlled by the programmable state machine 235 and/or a test program segment that is stored in a memory of the die frame LAU 115 or on the die under test 104. The test program segment may be written using any language convenient for compiling into the machine language of the LAU control unit 220. The programmable state machine 235 may be programmed using the system 310. Other programming approaches may be used for various embodiments.

The application of the signal vector(s) to the die 104 is controlled by the LAU control unit 220 in conjunction with a clock signal. LAU 115 clocking may be implemented using any logical combination of external and internal LAU clocks.

For one embodiment, the LAU control unit 220 may use one or more of the clocks 263 provided on the die 104 to control timing of the application of signal vectors and to determine response times for response vectors received from circuit(s) under test. It may be desirable, for example, for the LAU 115 to use the fastest available clock 263 on the integrated circuit die under test as an LAU sampling clock. In this manner, the LAU 115 can test integrated circuit die 104 circuit(s) at the fastest clock rate as well as being able to test circuits clocked at slower rates.

For some embodiments, the LAU control unit 220 may also shift a clock edge of an on-die clock signal 263 by controlling the programmable delay logic 265 on the integrated circuit die 104. The resulting shifted clock signal may be used to measure margin associated with a particular integrated circuit die 104 function, for example.

Also, for some embodiments, a dedicated LAU 115 clock (not shown) that provides for internal clocking at several fractions and/or an external clock 267, that may be provided on the external probe 215 or as part of the system 310 may be used to control testing. The external clock 267 may, for example, be coupled to drive the on-die clocks 263 via a pin or solder bump on the die 104. A multiplexed pin/solder bump may be provided in some embodiments to provide for the external clock connection.

For another embodiment, an external clock may be coupled to the die frame logic analyzer 115 via the external probe. Other types of external clocks and/or approaches to coupling the external clock to die frame LAU 115 circuitry and/or to circuitry on the integrated circuit die 104 may also be used.

The ability to use an external clock for some embodiments may provide some independence for the die frame LAU 115 from the integrated circuit die 104 as compared to using on-die clocks 263 such that the likelihood of post-silicon functionality of the die frame LAU 115 may be increased and/or the functionality of the die frame LAU 115 may be more easily measured.

In accordance with some embodiments, the LAU control unit 220 includes the capabilities to use triggers and/or filters to control or initiate test sequences. A trigger may be specified in terms of a logic equation or a particular condition, for example. A trigger may be used to determine when a particular test sequence should be initiated or when particular signal vector should be applied. For example, a trigger may be used to cause a particular set of signal vectors to be applied to a given circuit under test when a clock frequency reaches 500 MHz and a memory is turned off. It will be appreciated that many other conditions or combinations of conditions may be used to define a trigger. A trigger may be implemented by the programmable state machine 235 or through a program segment stored in a memory of the LAU 115 (e.g. the probe memory 247) or in a memory on the integrated circuit die 104 or system 310.

A filter is typically used to recognize a pattern in one or more signals being monitored. A filter may be set, for example, to determine when an address reaches a predetermined value. In response to the occurrence of the specified condition, a particular test sequence may be performed. A filter may be implemented using the pattern recognition unit 240 of the die frame LAU 115. Alternatively, a filter may be implemented using a program segment that is stored in a memory of the LAU 115, the integrated circuit die 104 or the system 310.

The LAU control unit 220 may also implement other common control functions (which may make use of triggers and/or filters) such as "branch on match," "loop until," and "call to a subroutine," for example, to control testing/analysis of the integrated circuit die 104. These control functions may be implemented using the programmable state machine 235, the pattern recognition unit 240 and/or through a control program segment stored in a memory of the die frame LAU 115, the integrated circuit die 104 or the system 310.

The LAU 115 of one embodiment is also capable of driving and sensing various types of signals and logic used by the integrated circuit die 104. For one embodiment, the signal typing control unit 245 enables the die frame LAU 115 to test edge-triggered and/or level-sensitive logic. Further, for some embodiments, the signal typing control unit 245 enables the LAU 115 to drive and sense signals that are positive or negative precharged signals, with and without retention and/or tristated signals, with and without retention. Additional types of signals are within the scope of various embodiments. This variety of available signal types provides the die frame LAU 115 with flexibility in terms of the types of tests that can be performed.

Additionally, the die frame LAU 115 of some embodiments is capable of reading from and/or writing to any integrated circuit die 104 memory elements to be tested, whether they are implemented as latches, flip-flops, registers or memory.

With continuing reference to FIGS. 1–3, in the exemplary embodiments described above, a single die flame logic analyzer unit has been describe in reference to testing/ analyzing a single integrated circuit die. It will be appreciated that a single die frame logic analyzer unit may be used to test multiple integrated circuit die in a serial or parallel manner. The particular integrated circuit di(c)e that is tested with a particular die frame logic analyzer in accordance with one embodiment depends on the configuration end placement of the external probe 215 and of the solder bumps or other electrical connection points provided on the external probe 215.

For one embodiment, multiple die frame logic analyzer units are provided on a single wafer such that the distance between any integrated circuit die to be analyzed/tested and an associated die frame logic analyzer unit is kept relatively short. For some embodiments, one die frame LAU per integrated circuit die may be provided. For other embodiments, the number of die frame LAUs provided on a single wafer is determined by the available die frame area taking into account other test structures 217 that may be desired to be included in the die frame area. For still other embodiments, a single die frame LAU is provided to test/ analyze any integrated circuit die on the host wafer.

As described above, the die frame LAU provides many of the capabilities of currently available, external logic analyzers. The die frame LAU of one embodiment, however, scales in performance with the technology of the integrated circuit dice to be tested. More specifically, the die frame LAU is fabricated using the same technology as the integrated circuit dice under test, may be clocked using on-die clocks and, thus, can keep pace with the technology to be tested.

Further, the functions provided by external logic analyzers change slowly as compared to corresponding advances in integrated circuit functionality and technology. Assuming this trend continues, the number of transistors used to implement a die frame LAU in accordance with various embodiments will not increase as quickly as the number of transistors in integrated circuit dice to be tested. Thus, the die frame LAU may take up a smaller percentage of wafer real estate as integrated circuit dice continue to increase in complexity. The die frame LAU of one embodiment may be implemented as a standard cell that can easily be included in the die frame area of a wafer.

Some embodiments of the die frame LAU may be designed and validated more robustly than the integrated circuit dice to be tested. In this manner, the incidence of LAU failures may be reduced thereby increasing the likelihood that a defective integrated circuit die can be analyzed by a corresponding, functional, die frame LAU.

Using die frame LAUs in accordance with the invention, integrated circuit manufacturers and testers may be able to realize significant savings related to test equipment by obviating a need for costly, external logic analyzers. As a need for external logic analyzers is reduced, so are the costs associated with maintenance, repair, etc. Further, because analysis of integrated circuit dice can be undertaken before assembly, additional cost savings may be realized by not packaging failing devices.

Other advantages and uses of the embedded LAU of various embodiments will also be appreciated from the previous description.

Figure 4:
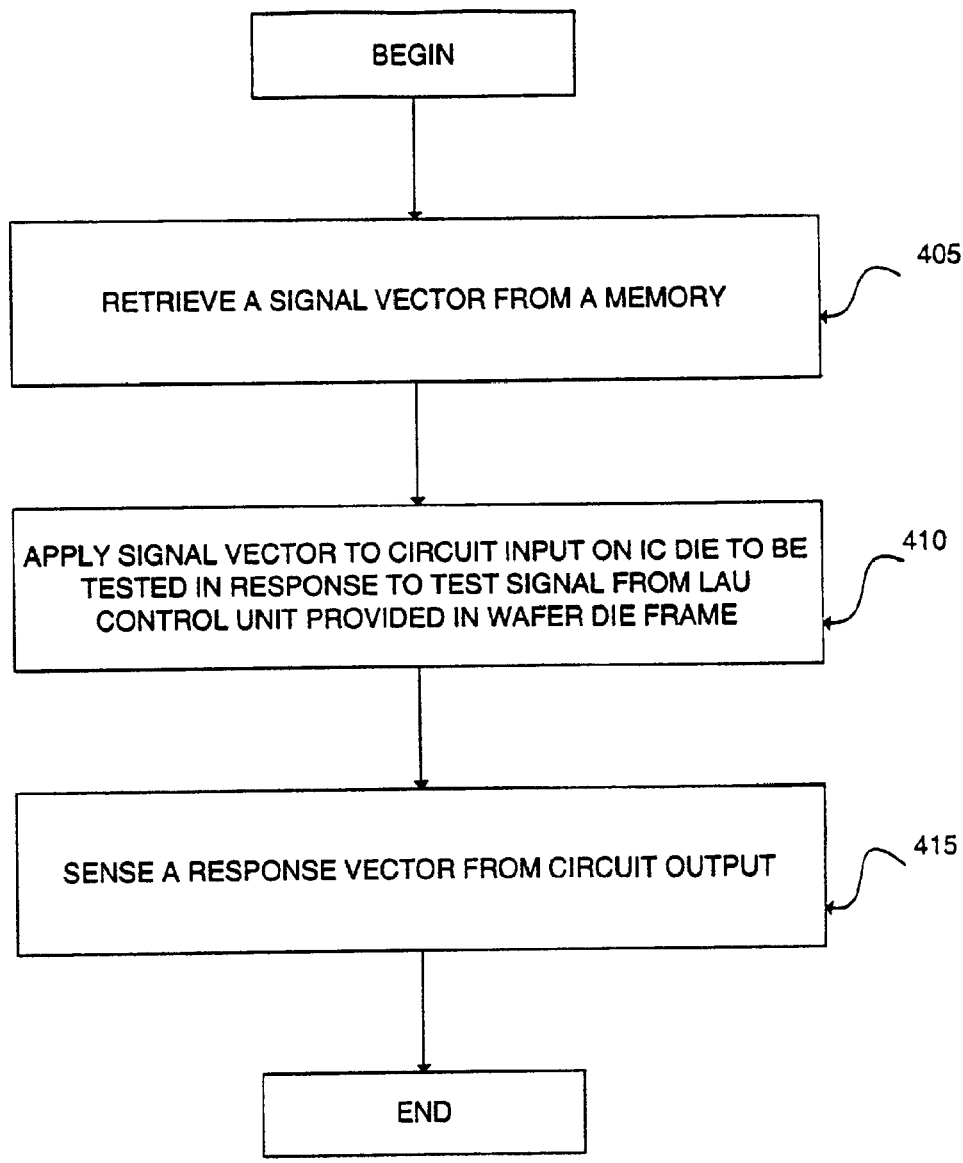
FIG. 4 is a flow diagram showing a method of one embodiment for analyzing an integrated circuit device using a die frame logic analyzer unit.

Referring now to FIG. 4, one embodiment of a method for testing and/or analyzing an integrated circuit die is described.

At processing block 405, a signal vector is retrieved from a memory. For one embodiment, the signal vector may be retrieved in response to a test program, user input, or a trigger or filter function, for example. Further, for one embodiment, the signal vector is stored in the memory after manufacture of the integrated circuit die to be tested.

At processing block 410, the signal vector is applied to an input of a first circuit to be tested on the integrated circuit in response to a test signal from a logic analyzer control unit provided in a die frame of a wafer that includes the integrated circuit.

At processing block 415, a response vector is received or sensed from the first circuit. For one embodiment, the response vector may be stored in a memory and/or displayed to a user.

For other embodiments, additional actions may be included such as measuring a response time of a circuit under test using a shifted clock signal and/or applying the signal vector in response to a shifted clock signal.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
a programmable die frame, logic analyzer unit, at least a first portion of the programmable die frame logic analyzer unit being provided in a die frame, the programmable die frame logic analyzer unit to test a function of an integrated circuit die on a wafer that includes the die frame.

2. The apparatus of claim 1 wherein the programmable die frame logic analyzer unit comprises:
a logic analyzer control unit; and
logic analyzer input/output circuitry coupled to the logic analyzer control unit.

3. The apparatus of claim 2 wherein the logic analyzer control unit comprises a signal typing control unit to enable testing of a plurality of different signal types.

4. The apparatus of claim 2 wherein the logic analyzer control unit comprises:
a pattern generator unit to generate a test pattern for the integrated circuit die; and
a programmable state machine coupled to the pattern generator unit to control a test sequence during testing of the integrated circuit die.

5. The apparatus of claim 4 further including a pattern recognition unit coupled to the programmable state machine, the pattern recognition unit to recognize a pattern during testing of the integrated circuit die and to cause execution of a triggerable program in response to recognizing the pattern.

6. The apparatus of claim 1 further comprising:
a clock to be coupled to the programmable die frame logic analyzer unit; and
programmable clock delay logic to be coupled to the clock and the programmable logic analyzer unit, the programmable clock delay logic being programmable by the die frame logic analyzer unit to generate a shifted clock signal.

7. The apparatus of claim 1 wherein the programmable die frame logic analyzer unit is capable of being clocked by a clock external to the wafer.

8. The apparatus of claim 1, wherein the programmable die frame logic analyzer unit is to be coupled to the integrated circuit die using an external probe.

9. The apparatus of claim 8 wherein, the programmable die frame logic analyzer unit is to be coupled to multiple integrated circuit die using the external probe.

10. A method comprising:

retrieving a signal vector from a memory;

applying the signal vector to an input of a first circuit on an integrated circuit to be tested in response to a test signal from a programmable logic analyzer unit, at least a portion of which is provided in a die frame of a wafer that includes the integrated circuit; and sensing a response vector from an output of the first circuit.

11. The method of claim 10 further comprising:

coupling the logic analyzer unit via an external probe to multiple integrated circuits to be analyzed.

12. The method of claim 10 further comprising:

coupling the logic analyzer unit to the integrated circuit using an external probe.

13. The method of claim 12 further comprising:

shifting an edge of a clock signal using circuitry on the integrated circuit to generated a shifted clock signal, wherein applying the signal vector comprises using the shifted clock signal.

14. The method of claim 13 further comprising:

measuring a response time of the circuit in reference to the shifted clock signal.

15. The method of claim 13 further comprising:

recognizing a predetermined signal pattern; and triggering a program stored on the integrated circuit in response to recognizing the predetermined signal pattern.

16. The method of claim 10 further comprising:

executing a program stored on the logic analyzer unit after manufacture of the integrated circuit to test a function of the integrated circuit.

17. The method of claim 10 further comprising:

storing the response vector in a memory.

18. A wafer comprising:

a plurality of integrated circuit dice; and a programmable die frame logic analyzer unit, at least a portion of which is provided in a die frame area outside the integrated circuit dice.

19. The wafer of claim 18 wherein the die frame logic analyzer unit is to be coupled to at least one of the integrated circuit dice using an external probe.

20. The wafer of claim 19 wherein the external probe comprises a memory to store at least one of signal vectors, response vectors, reference vectors and a triggerable program.

21. The wafer of claim 19 wherein the external probe is coupled to a system by an input/output cable, the system comprising at least one input device and at least one output device, the input device to enable a user to control the logic analyzer unit, the output device to provide results of testing of an integrated circuit die on the wafer by the logic analyzer unit.

22. The wafer of claim 19 wherein multiple die frame logic analyzer units are provided, at least a portion of each of the multiple die frame logic analyzer units to be provided in the die frame area.

23. The wafer of claim 19 wherein the die frame logic analyzer unit comprises a logic analyzer control unit implemented using a processor core.

24. The wafer of claim 23 wherein the processor core is a microprocessor core.

25. The wafer of claim 23 wherein the logic analyzer control unit is programmable to control testing of the integrated circuit dice.

26. The wafer of claim 23 wherein the logic analyzer control unit comprises a signal typing control unit to enable testing of a plurality of different signal types.

27. The wafer of claim 23 wherein the logic analyzer control unit comprises:

a pattern generator unit to generate a test pattern for the integrated circuit die; and a programmable state machine coupled to the pattern generator unit to control a test sequence during testing of the integrated circuit die.

28. The wafer of claim 27 further comprising a pattern recognition unit coupled to the programmable state machine, the pattern recognition unit to recognize a pattern during testing of the integrated circuit die and to cause execution of a triggerable program in response to recognizing the pattern.

29. The wafer of claim 18 further comprising:

a clock to be coupled to the programmable die frame logic analyzer unit; and programmable clock delay logic to be coupled to the clock and the programmable logic analyzer unit, the programmable clock delay logic being programmable by the die frame logic analyzer unit to generate a shifted clock signal.

30. The wafer of claim 19 wherein the programmable die frame logic analyzer unit is capable of being clocked by a clock external to the wafer.

31. The wafer of claim 30 wherein the clock external to the wafer is provided on the external probe.

* * * * *